United States Patent
Felix

(10) Patent No.: US 7,880,506 B2
(45) Date of Patent: Feb. 1, 2011

(54) RESOLVING METASTABILITY

(75) Inventor: Stephen Felix, Bristol (GB)

(73) Assignee: Icera Inc., Wilmington, DE (US)

( * ) Notice: Subject to any disclaimer, the term of this patent is extended or adjusted under 35 U.S.C. 154(b) by 0 days.

(21) Appl. No.: 12/713,412

(22) Filed: Feb. 26, 2010

(65) Prior Publication Data

US 2010/0225351 A1   Sep. 9, 2010

(30) Foreign Application Priority Data

Mar. 3, 2009   (GB) .................................. 0903687.2

(51) Int. Cl.
*H03K 19/00* (2006.01)
(52) U.S. Cl. .......................................... 326/94; 326/98
(58) Field of Classification Search ............. 326/93–98, 326/21, 26–28
See application file for complete search history.

(56) References Cited

U.S. PATENT DOCUMENTS

| | | | |
|---|---|---|---|
| 4,469,964 A | 9/1984 | Guttag et al. | |
| 4,544,851 A | 10/1985 | Conrad et al. | |
| 4,617,480 A | 10/1986 | Au | |
| 4,808,840 A * | 2/1989 | Chung et al. | 327/206 |
| 4,929,850 A * | 5/1990 | Breuninger | 327/198 |
| 4,999,528 A | 3/1991 | Keech | |
| 5,034,967 A | 7/1991 | Cox et al. | |
| 5,789,945 A | 8/1998 | Cline | |
| 6,072,346 A | 6/2000 | Ghahremani | |
| 6,429,692 B1 | 8/2002 | Chan et al. | |
| 6,512,406 B1 | 1/2003 | Dike | |
| 6,531,905 B1 | 3/2003 | Wang | |
| 6,771,099 B2 | 8/2004 | Cavazos et al. | |
| 2002/0180589 A1 * | 12/2002 | Gabara | 340/146.2 |
| 2003/0112047 A1 * | 6/2003 | Dike | 327/202 |

* cited by examiner

*Primary Examiner*—Don P Le

(57) ABSTRACT

A logic circuit latch including an input stage for receiving a logical input signal and a pair of differential amplifiers, each having an input operatively coupled to the input stage, and at least one of them having an output arranged to supply the logical output of the latch. Each of the differential amplifiers includes a transistor connected as a load, and an output of each of the differential amplifiers is coupled to bias the load transistor of the other differential amplifier. If the latch switches from the transparent state to the closed state while the logical input signal is transitioning between logical levels, the differential amplifiers drive up the logical output of the latch if the logical input signal transitions from a first to a second logical level, and drive down the logical output of the latch if the input signal transitions from the second to the first logical level.

24 Claims, 6 Drawing Sheets

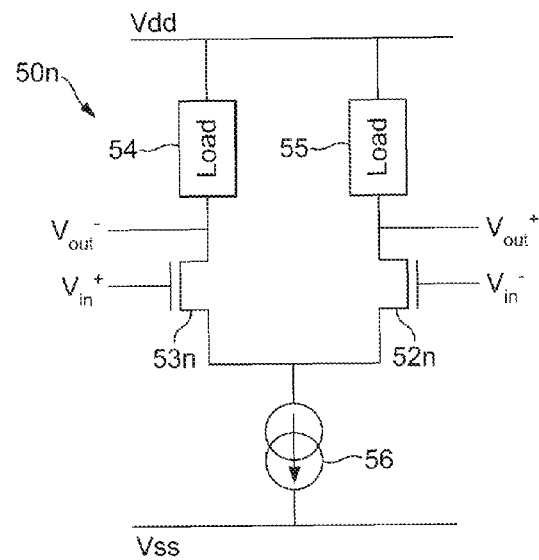
FIG. 3a
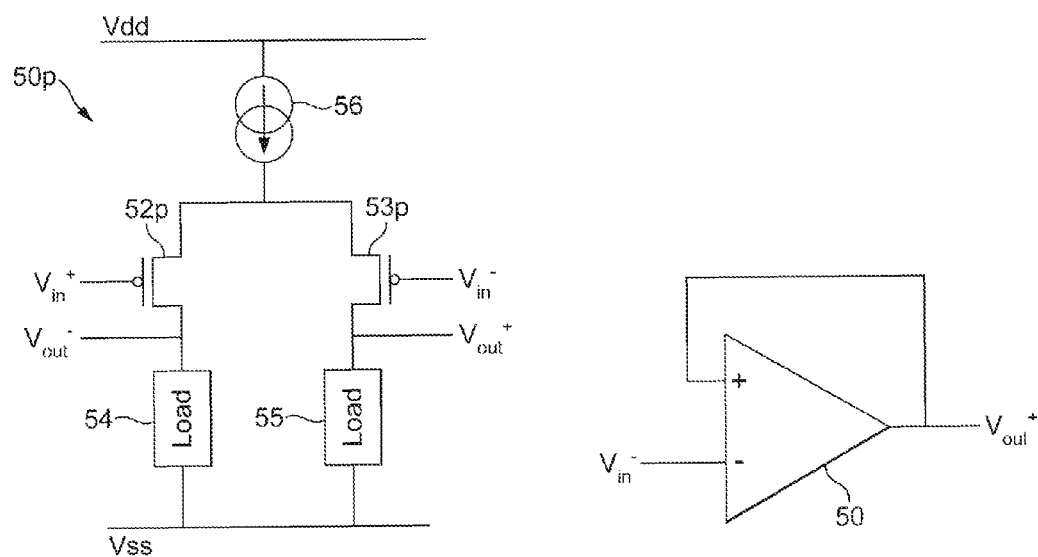
FIG. 3b
FIG. 4

RESOLVING METASTABILITY

CROSS-REFERENCE TO RELATED APPLICATION

This application claims the benefit of GB Application No. 0903687.2, filed on Mar. 3, 2009, entitled "RESOLVING METASTABILITY," commonly assigned with this application and incorporated herein by reference in its entirety.

TECHNICAL FIELD

This application relates to latches for logic circuits such as CMOS circuits.

BACKGROUND

"Complementary metal oxide semiconductor" (CMOS) is an example of a technology for use in integrated circuits (or ICs) which uses metal oxide semiconductor field effect transistors (MOSFETS). These may be either n-type channel MOSFETS (NMOS transistors) or p-type channel MOSFETS (PMOS transistors).

In a synchronous digital sub-system within a circuit such as a CMOS integrated circuit, it is frequently necessary to receive messages that have asynchronous timing with respect to the part of the sub-system that must receive the message. Such asynchronous messages may have been sent from other synchronous sub-systems which have relatively asynchronous clocks with respect to the receiving subsystem, or may arrive from some external source.

To determine whether the arriving asynchronous digital signal is logically a 'zero' or a 'one', the synchronous receiving circuit includes a latch circuit that samples the incoming signal when a local clock signal transitions. When the latch has sampled, its output should reflect the state of the received signal when the clock transitioned.

However, if the incoming signal is in the process of changing between the two binary states when the clock transition occurs, then it can take a relatively long time before the latch output settles to a voltage that represents one of the two binary states to any subsequent logic gate. This phenomenon is known as metastability.

This can be particularly problematic in any situation where the sampled signal is used directly or indirectly to update more than a single bit of state within the receiving circuit. In this case, the updated state bit values may themselves be metastable or may imply conflicting decisions about the state of the sampled signal. Thus, the digital receiver circuit can fail to behave like the digital state machine model from which it was derived and thus will fail to function correctly.

The situation is illustrated schematically in FIG. 1, which shows a digital logic circuit including two internally synchronous subsystems 10 and 20 that are relatively asynchronous with respect to one another. The first subsystem includes a first clock 12 (Ck1) arranged to generate a first clock signal, along with components connected to be clocked by the first clock signal including a transmitting component 14 (Tx), thus forming a first clock domain. The second subsystem 20 includes a second clock 22 (Ck2) arranged to generate a second clock signal, along with components connected to be clocked by the second clock signal including a latch 24 and one or more receiving components 26a and 26b (Rx), thus forming a second clock domain. The output of the transmitting component 14 in the first subsystem 14 is connected to the input of the latch 24 in the second subsystem 20, and the output of the latch 24 is coupled to inputs of the receiving components 26a and 26b in the second subsystem 20. The transmitting component 14 sends a logic signal from the first subsystem 10 to the second subsystem 20, timed according to the first clock signal. The latch 24 receives this logic signal at its input, but only adopts the signal's logical value at its output on a tick of the second clock signal, thus synchronizing the timing of the received logic signal to the second clock signal. However, if the clock ticks while the received logic signal is in transition between two logical levels, from one to zero or vice versa, then as discussed the resulting metastability can be slow to resolve and thus may lead to errors. For example, the two receiving components 26a and 26b may detect different logical values.

To minimize the likelihood of such problems, it is important that the output of the sampling latch circuit (e.g., 24) resolves quickly enough to a value representing an unambiguous digital zero or one with an extremely low probability of failure.

Traditionally, a clocked CMOS feedback latch circuit has been used for this task. When the clock is in one state, the latch is said to be "transparent" reflecting the input state at the output terminal. When the clock transitions to the other state, the input becomes irrelevant, the latch is said to be "closed" and an internal feedback circuit is turned on. It is this positive feedback loop that resolves a meta-stable output voltage to a value representing an unambiguous digital state.

A typical example is illustrated schematically in FIG. 2. This commonly used CMOS latch circuit is 'transparent' (output Q becomes equal to input D) while the clock input CK=Vss=0V (logic 0) and 'closed' when CK=Vdd (logic 1). When the latch is closed, MOS transistors n1 and p1 are off while transistors n3 and p3 are on. This closes the feedback loop consisting of the inverter i1 and the tri-state gate including transistors n3, n4, p3 and p4.

The speed with which this feedback loop can resolve a metastable value depends on many factors—one of them being the power supply voltage (Vdd).

If the feedback loop is included of two inverting CMOS logic gates (for example CMOS inverters, transmission gates, tri-state drivers) connected back-to-back then the speed of metastability resolution degrades very rapidly when the supply voltage becomes less than two times the MOS device threshold voltage ($V_{threshold}$). This is because when the circuit is in the metastable state, both of the logic gates' inputs are at approximately half the supply voltage (Vdd). If Vdd<$2V_{threshold}$, this means that the MOS devices have a gate-source voltage Vgs≈Vdd/2<$V_{threshold}$, meaning that they are in or near to the sub-threshold region of operation and conducting very little current indeed; making the voltage change necessary to resolve the metastable state extremely slow initially.

CMOS logic continues to work relatively fast at Vdd=$2V_{threshold}$, slowing down dramatically as Vdd approaches $V_{threshold}$.

There is a strong incentive to minimize the power consumption of integrated circuits for mobile (battery powered) applications by setting Vdd to the minimum value at which the circuits are still functional.

If part of their functionality includes resolving metastability, then there is a danger that the metastability resolving latch circuits will limit the level to which Vdd can be reduced rather than the speed of the CMOS logic; potentially making power consumption higher than otherwise necessary in a low-speed mode of operation.

Special, low $V_{threshold}$ devices can be used in the resolving latch circuit to enhance performance at low supply voltages. However, it costs more to manufacture integrated circuits that include such devices. If the resolvers are the only circuits in the integrated circuit that require such special devices, then this solution can make the IC more costly.

Some synchronizing (i.e., metastability resolving) latch circuits have been disclosed. They fall into two groups.

Firstly there are enhanced versions of the circuit illustrated in FIG. 2 (two back-to-back CMOS gates). Examples are:

U.S. Pat. No. 4,617,480—"High speed data synchronizer which minimizes circuitry"

U.S. Pat. No. 4,469,964—"Synchronizer circuit"

U.S. Pat. No. 4,544,851—"Synchronizer circuit with dual input"

U.S. Pat. No. 6,512,406—"Backgate biased synchronizing latch"

U.S. Pat. No. 6,072,346—"Metastable protected latch"

However, all of these are still subject to the performance limitations at low operating voltages, as described above.

Secondly, there are ideas based on the false premise that any immediate binary decision can be made either implicitly or explicitly based on a meta-stable value (including detecting whether the value is or is not meta-stable). Examples are:

U.S. Pat. No. 5,034,967—"Metastable-free digital synchronizer with low phase error"

U.S. Pat. No. 6,771,099—"Synchronizer with zero metastability"

U.S. Pat. No. 6,531,905—"Flip-flop with metastability reduction"

U.S. Pat. No. 4,999,528—"Metastable-proof flip-flop"

SUMMARY

According to one aspect of the present disclosure, there is provided a logic circuit latch for switching between a transparent state in which a logical output of the latch follows a logical input signal and a closed state in which the logical output is latched. In one embodiment, the latch includes: (1) an input stage for receiving the logical input signal and (2) a pair of differential amplifiers, each having an input operatively coupled to the input stage of the latch, and at least one of the differential amplifiers having an output arranged to supply the logical output of the latch. Each of the differential amplifiers includes a transistor connected as a load, and an output of each of the differential amplifiers is coupled to bias the load transistor of the other differential amplifier. So as, if the latch switches from the transparent state to the closed state while the logical input signal is transitioning between logical levels, to drive up the logical output of the latch if the logical input signal transitions from a first to a second logical level, and to drive down the logical output of the latch if the input signal transitions from the second to the first logical level.

According to another aspect, a circuit is disclosed having a supply voltage and including a logic circuit latch for switching between a transparent state in which a logical output of the latch follows a logical input signal and a closed state in which the logical output is latched. In one embodiment of the circuit, the latch includes: (1) an input stage for receiving the logical input signal and (2) a pair of differential amplifiers, each having an input operatively coupled to the input stage of the latch, and at least one of the differential amplifiers having an output arranged to supply the logical output of the latch. Each of the differential amplifiers includes a transistor connected as a load, and an output of each of the differential amplifiers is coupled to bias the load transistor of the other differential amplifier. So as, if the latch switches from the transparent state to the closed state while the logical input signal is transitioning between logical levels, to drive up the logical output of the latch if the logical input signal transitions from a first to a second logical level, and to drive down the logical output of the latch if the input signal transitions from the second to the first logical level, wherein the latch is made up of transistors all having substantially the same threshold voltage, and the supply voltage of the circuit is substantially equal to or less than twice the threshold voltage of the transistors making up the latch.

According to a further aspect, a battery powered portable device, including a logic circuit latch for switching between a transparent state in which a logical output of the latch follows a logical input signal and a closed state in which the logical output is latched, is disclosed. In one embodiment of the battery power portable device, the latch includes: (1) an input stage for receiving the logical input signal and (2) a pair of differential amplifiers, each having an input operatively coupled to the input stage of the latch, and at least one of the differential amplifiers having an output arranged to supply the logical output of the latch. Each of the differential amplifiers includes a transistor connected as a load, and an output of each of the differential amplifiers is coupled to bias the load transistor of the other differential amplifier. So as, if the latch switches from the transparent state to the closed state while the logical input signal is transitioning between logical levels, to drive up the logical output of the latch if the logical input signal transitions from a first to a second logical level, and to drive down the logical output of the latch if the input signal transitions from the second to the first logical level.

According to yet another aspect, a method of operating a latch is disclosed. In one embodiment the method includes: (1) receiving a logical input signal, (2) operating the latch in a transparent state in which a logical output of the latch follows the logical input signal, (3) switching the latch to a closed state in which the logical output is latched, (4) supplying the logical output from at least one of a pair of differential amplifiers forming part of the latch and (5) biasing a load transistor of one of the differential amplifiers using the output of the other, and vice versa. So as, if the latch switches from the transparent state to the closed state while the logical input signal is transitioning between logical levels, to drive up the logical output of the latch if the logical input signal transitions from a first to a second logical level, and to drive down the logical output of the latch if the input signal transitions from the second to the first logical level.

According to yet an additional aspect, disclosed herein is a method of manufacturing a circuit including a logic circuit latch for switching between a transparent state in which a logical output of the latch follows a logical input signal and a closed state in which the logical output is latched. In one embodiment of manufacturing, the latch includes: (1) an input stage for receiving the logical input signal and (2) a pair of differential amplifiers, each having an input operatively coupled to the input stage of the latch, and at least one of the differential amplifiers having an output arranged to supply the logical output of the latch. Each of the differential amplifiers includes a transistor connected as a load, and an output of each of the differential amplifiers is coupled to bias the load transistor of the other differential amplifier. So as, if the latch switches from the transparent state to the closed state while the logical input signal is transitioning between logical levels, to drive up the logical output of the latch if the logical input signal transitions from a first to a second logical level, and to drive down the logical output of the latch if the input signal transitions from the second to the first logical level, including manufacturing the latch from transistors all having substantially the same threshold voltage, and arranging for the supply voltage of the circuit to be substantially equal to or less than twice the threshold voltage of the transistors making up the latch.

Still another aspect disclosed herein is another battery powered portable device that includes a circuit having a supply voltage and includes a logic circuit latch for switching between a transparent state in which a logical output of the latch follows a logical input signal and a closed state in which the logical output is latched. In one embodiment of this battery powered portable device, the latch includes: (1) an input stage for receiving the logical input signal and (2) a pair of differential amplifiers, each having an input operatively coupled to the input stage of the latch, and at least one of the differential amplifiers having an output arranged to supply the logical output of the latch. Each of the differential amplifiers includes a transistor connected as a load, and an output of each of the differential amplifiers is coupled to bias the load transistor of the other differential amplifier. So as, if the latch switches from the transparent state to the closed state while the logical input signal is transitioning between logical levels, to drive up the logical output of the latch if the logical input signal transitions from a first to a second logical level, and to drive down the logical output of the latch if the input signal transitions from the second to the first logical level, wherein the latch is made up of transistors all having substantially the same threshold voltage, and the supply voltage of the circuit is substantially equal to or less than twice the threshold voltage of the transistors making up the latch.

BRIEF DESCRIPTION

Reference is now made to the following descriptions taken in conjunction with the accompanying drawings, in which:

FIG. 3a is a schematic diagram of a differential amplifier;

FIG. 3b is a schematic diagram of another differential amplifier;

FIG. 4 is a schematic diagram of a differential amplifier connected in a positive feedback arrangement;

DETAILED DESCRIPTION

Figure 1:
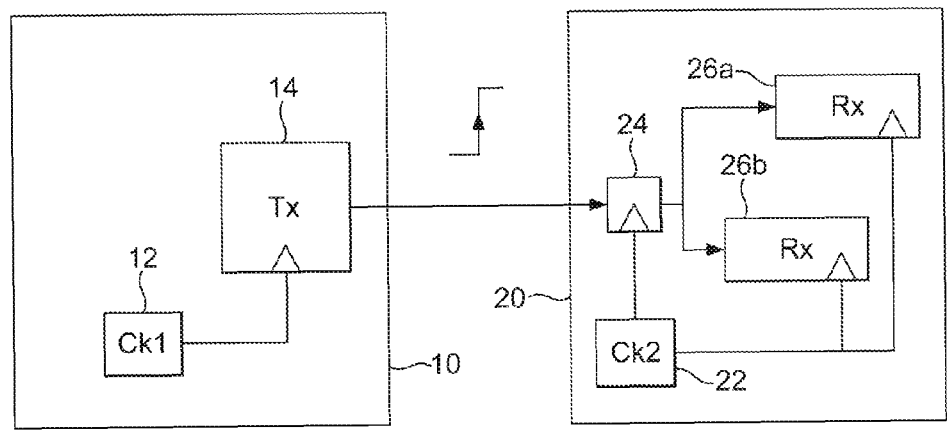
FIG. 1 is a schematic illustration of signaling between internally synchronous subsystems having relatively asynchronous timing with respect to one another.

Because the premise behind the above noted ideas for synchronizing latch circuits can be considered fundamentally flawed, these circuits may not actually work as desired. As such, a latch circuit that could resolve metastability quickly at low voltages is desirable. Accordingly, the present application discloses an improved latch circuit.

In order to drive the output of a latch and thus increase its speed in resolving metastability, the present application uses a pair of differential amplifiers each having a transistor connected in the load position and each having its output coupled to bias the load transistor of the other. The disclosed latch circuit can perform exceptionally fast at resolving meta-stability, even at relatively low supply voltages. Further, it can be built from the same, standard $V_{threshold}$ transistors used in the CMOS logic gates and requires no special "low $V_{threshold}$" transistors.

In one embodiment of the latch circuit, like a normal CMOS latch, once the output has resolved to a voltage equal to Vdd or 0 v then no supply current need be consumed (other than device leakage currents). Further, no special bias voltages or currents may be needed.

In some embodiments, each of the differential amplifiers may be connected in a positive feedback arrangement such that a change at the output of the respective differential amplifier reinforces a change at its input. Each of the differential amplifiers may include a non-inverting input, an inverting input, an output and a complementary output. Additionally, the output of a first of the differential amplifiers may be coupled back to the non-inverting input of a second of the differential amplifiers, the complementary output of the first differential amplifier may be coupled back to the inverting input of the second differential amplifier, the output of the second differential amplifier may be coupled back to the non-inverting input of the first differential amplifier, and the complementary output of the second differential amplifier may be coupled back to the inverting input of the first differential amplifier.

Each of the differential amplifiers may include a first branch having an output and a respective load transistor, and a second branch having a complementary output and a respective second load transistor. Additionally, the output from the first branch of the first differential amplifier may be coupled to bias the load transistor in the second branch of the second differential amplifier, the complementary output from the second branch of the first differential amplifier may be coupled to bias the load transistor in the first branch of the second differential amplifier, the output from the first branch of the second differential amplifier may be coupled to bias the load in the second branch of the first differential amplifier, and the complementary output from the second branch of the second differential amplifier may be coupled to bias the load in the first branch of the first differential amplifier.

A first of the differential amplifiers may include an arrangement of transistors each of a respective semi-conductor type, and a second of the differential amplifiers may include a corresponding arrangement of transistors each of the opposite semiconductor type to a counterpart in the first, with the corresponding arrangement being inverted with respect to the supply rails.

Each of the differential amplifiers may include a long-tailed pair arrangement including a pair of long-tailed transistors, a pair of long-tail transistors and a pair of loads. The long-tailed and long-tail transistors of a first of the differential amplifiers may be of a first semiconductor type and the load transistors of the first differential amplifier may be of a second, opposite semi-conductor type. Additionally, the long-tailed and long-tail transistors of a second of the differential amplifiers may be of the second semiconductor type and the load transistors of the second differential amplifier may be of the first semi-conductor type.

In each of the differential amplifiers: (1) each of the long-tailed, long-tail and load transistors may include two conducting terminals and a control terminal for controlling conduction between the two respective conducting terminals; (2) each long-tail transistor of the pair may have one conducting terminal coupled to a supply rail, its other conducting terminal coupled to the other conducting terminal of the other long-tail transistor of the pair and to a conducting terminal of a respective one of the long-tailed transistors, and its control terminal coupled to the control terminal of its respective long-tail transistor and to the other conducting terminal of the other long-tailed transistor and (3) each of the long-tailed transistors may have the other conducting terminal coupled to a conducting terminal of a respective one of the load transistors, and the other conducting terminal of each load transistor may be coupled to another supply rail. Furthermore, a node between one of the long-tailed transistors and its respective load transistor may be arranged to provide an output of the differential amplifier, and a node between the other of the long-tailed transistors and its respective load transistor may be arranged to provide a complementary output of the differential amplifier, wherein the former of the load transistors may be biased by the complementary output from the other of the differential amplifiers and the latter of the load transistors may be biased by the output from that other differential amplifier.

Each of the differential amplifiers may be coupled to a supply rail via a further transistor arranged as a switch, which may be arranged such that when the latch is closed then both differential amplifiers are connected to a power supply, and when the latch is transparent then only one of the two differential amplifiers is connected to the power supply at any one time depending on the logical level of the input signal.

The input stage may be arranged to supply a combination of inputs representing said logical input signal to a first of the differential amplifiers, and to supply a complementary combination of inputs to a second of the differential amplifiers.

As discussed herein, a circuit may be provided including a latch having any of the above features, wherein the latch is made up of transistors all having substantially the same threshold voltage, and the supply voltage of the circuit is substantially equal to or less than twice the threshold voltage of the transistors making up the latch. The circuit may be a CMOS circuit and the threshold voltage may be the CMOS threshold voltage.

Figure 7:
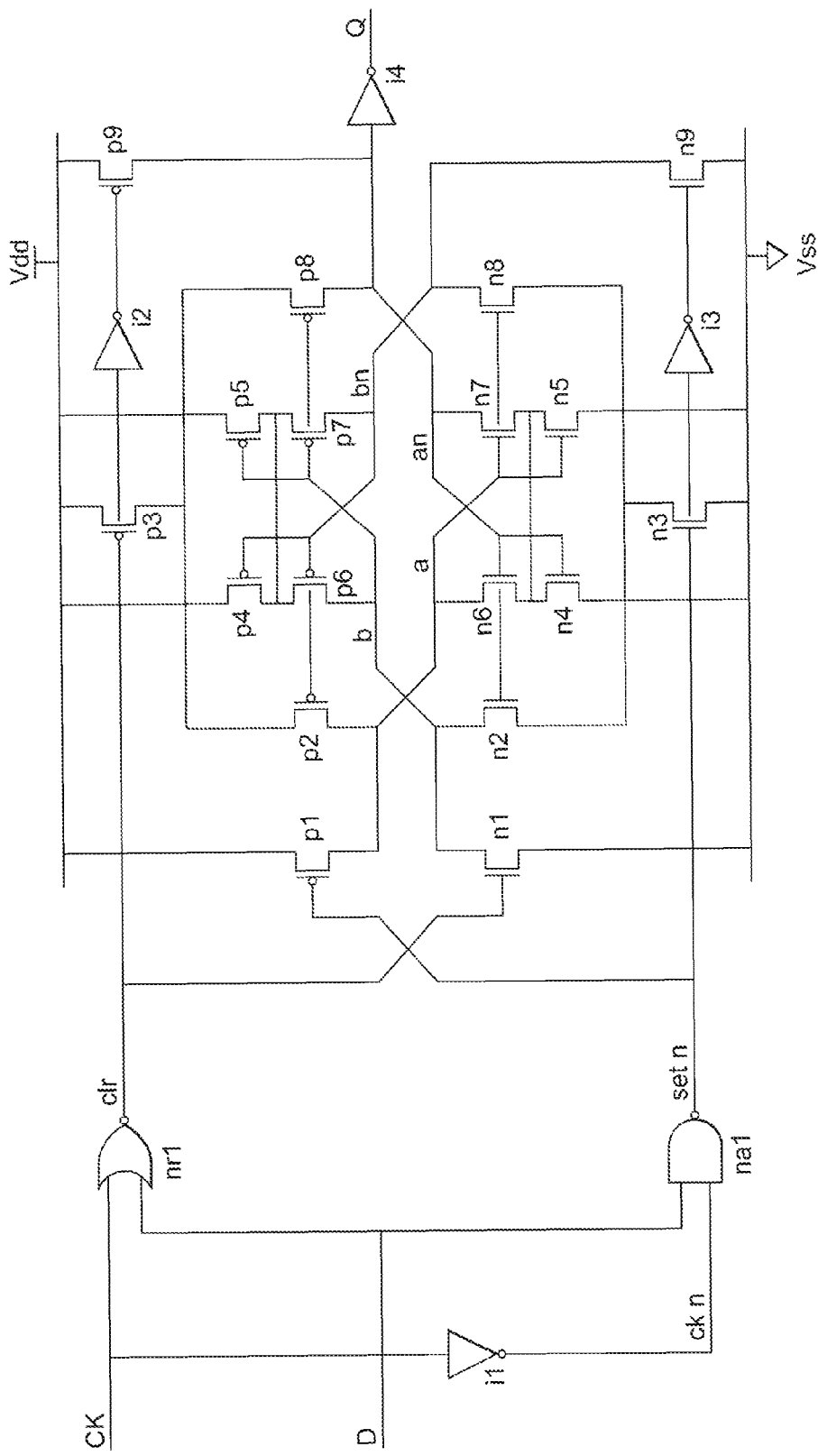
FIG. 7 is a schematic diagram of another latch.

A metastability resolving latch according to an embodiment of the disclosure is shown schematically in FIG. 7. It is functionally equivalent to the latch of FIG. 2 and has the same input terminals (CK, D) and output (Q), but it is faster to resolve metastability at low voltages.

The latch of FIG. 7 includes a pair of differential amplifiers. As mentioned, the outputs of the two differential amplifiers are used to bias each others' load devices in a positive feedback arrangement that results in their output nodes resolving quickly to the upper supply voltage (Vdd) or lower supply voltage (Vss) and consuming no DC supply current when they have done so.

A differential amplifier is a device having two inputs, usually referred to as the inverting and non-inverting inputs, and which is configured so as to amplify a difference between the two inputs.

The most common principle of operation behind a differential amplifier is illustrated schematically in FIGS. 3a and 3b. As will be familiar to person skilled in the art, a transistor includes a first conducting terminal, a second conducting terminal, and a control terminal arranged to control conduction between the first and second conducting terminals. In the case of MOSFETs, the first and second conducting terminals may be termed the source (S) and drain (D) and the control terminal may be termed the gate (G). The differential amplifier 50 includes two parallel branches of components coupled in series between the upper and lower supply rails Vdd and Vss. Each branch includes a load component 54 or 55 coupled between one of the supply rails and the first conducting terminal of a first transistor 52 or 53 respectively. The second conducting terminal is coupled to the other supply rail via a current source 56 or other equivalent current supply circuitry, which is configured such that the total current flowing in both branches is substantially constant.

In the example of FIG. 3a, each branch includes a load component 54 or 55 coupled between the upper supply rail and the drain of an NMOS transistor 52n or 53n respectively, with the source of the NMOS being coupled to the lower supply rail via a current source 56. In the example of FIG. 3b, each branch includes a load component 54 or 55 coupled between the lower supply rail and the drain of a PMOS transistor 52p or 53p respectively, with the source of the PMOS being coupled to the upper supply rail via a current source 56.

Transistors connected in this arrangement are often referred to in the art as a "long-tailed pair". According to this terminology, the long-tailed transistors 52 and 53 themselves may also be referred to as the "common-source" transistors, of which the current source 56 or other equivalent current supply circuitry coupled between the source and supply rail forms the actual "long tail" of the name. The components coupled between the drains and the other supply rail form the load. In the figures, the numerals 50n and 50p are use to denote a differential amplifier of principally n-type or p-type construction respectively, having at least the common-source transistors being of the respective type.

The gates of the two transistors 52 and 53 act as the two inputs of the differential amplifier. One is referred to as the inverting input and has an input voltage $V_{in}^-$, and the other is referred to as the non-inverting input and has an input voltage $V_{in}^+$ (which way around they are termed is arbitrary in this arrangement since the branches are symmetrical with respect to one another). The output is taken from the node between the common-source transistor 53 and its respective load component 55 in the branch opposite that of the inverting input, and has an output voltage $V_{out}^+$. A complement of the output voltage $V_{out}^-$ can also be taken from the corresponding node between the common-source transistor 52 and its load component 54 in the other branch.

Referring to FIG. 3a, if $V_{in}^+$ rises relative to $V_{in}^-$ then the gate-source voltage of the NMOS transistor 52n in the left branch is increased, causing it to turn on more so that more current flows in the left branch. Because the total current in both branches is kept substantially constant, this means less current must flow in the right branch and so the voltage dropped across the load component 55 in the right branch decreases, pulling up $V_{out}^+$ by some amount dependent on the properties of the components involved. Thus $V_{out}^+$ is an amplification of the difference $V_{in}^+ - V_{in}^-$.

Referring to FIG. 3b, if $V_{in}^+$ rises relative to $V_{in}^-$ then the gate-source voltage of the PMOS transistor 52p in the left branch is decreased, causing it to turn off more so that less current flows in the left branch. Because the total current in both branches is kept substantially constant, this means more current must flow in the right branch and so the voltage dropped across the load component 55 in the right branch increases, pushing up $V_{out}^+$. Thus again $V_{out}^+$ is an amplification of the difference $V_{in}^+ - V_{in}^-$.

By similar reasoning, it can be seen that in either arrangement $V_{out}^-$ is and amplification of the difference $V_{in}^- - V_{in}^+$, and may be considered as a complement of the output voltage $V_{out}^+$.

As shown schematically in FIG. 4, a differential amplifier 50 can be connected in a positive feedback arrangement, with the output coupled back to the non-inverting input. This has the effect that a change in voltage at the output reinforces a change at the input, and so forth in a positive feedback loop.

Figure 2:
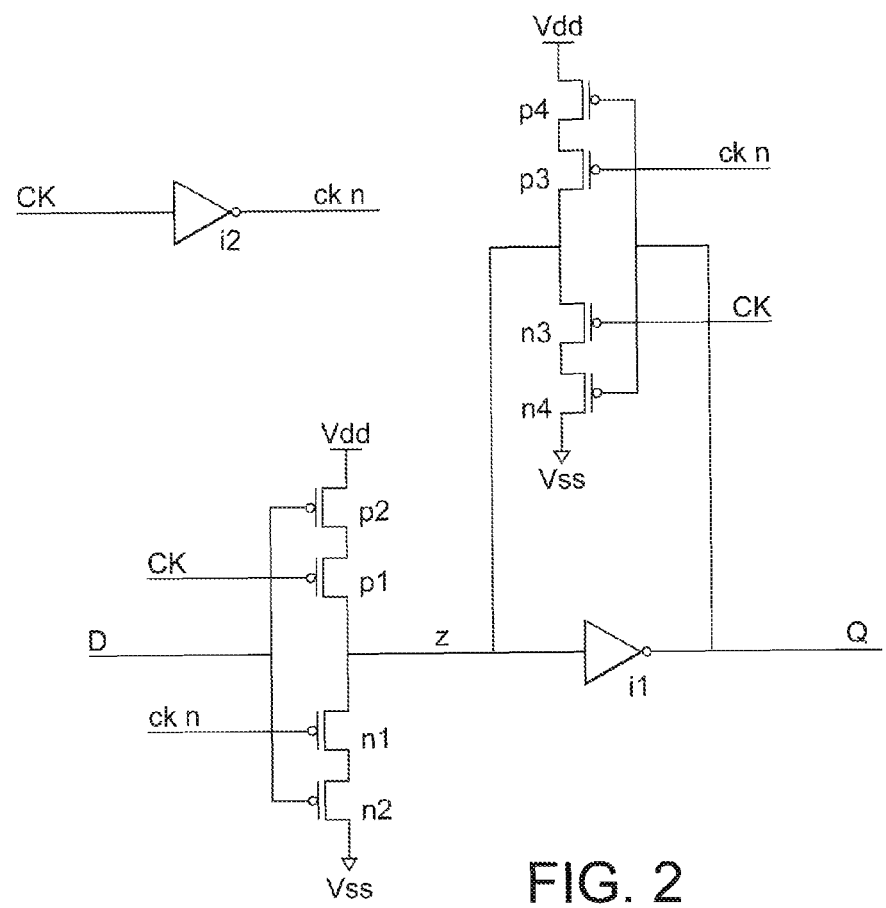
FIG. 2 is a schematic diagram of a latch.
Figure 5:
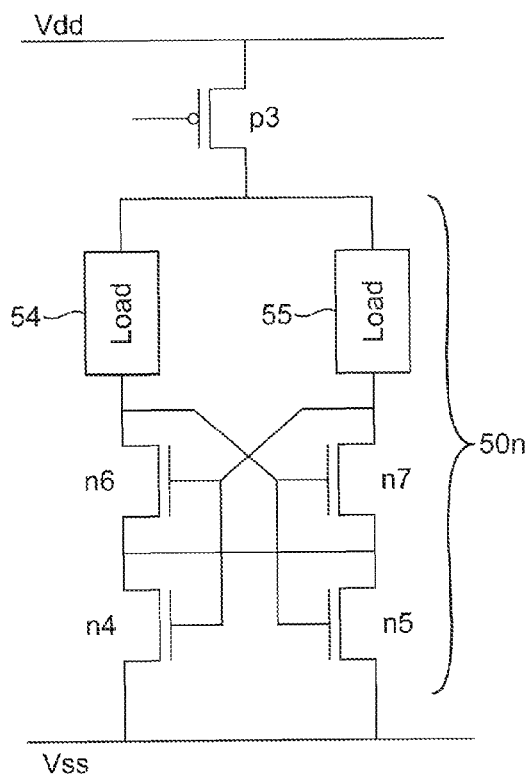
FIG. 5 is another schematic diagram showing a differential amplifier connected in a positive feedback arrangement.

A particular implementation of a differential amplifier 50n connected in a positive feedback arrangement is shown in FIG. 5 (note that the numbering of devices does not correspond to that of FIG. 2). The differential amplifier 50n includes a long-tailed pair arrangement, including NMOS transistors n6 and n7 as the long-tailed transistors (i.e. common-source transistors), and NMOS transistors n4 and n5 as the long-tails (not the long tailed) providing the current supply circuitry, as well as load components 54 and 55.

In the left branch, a first long-tail n4 has its source coupled to the lower supply rail and its drain coupled to the source of a first common-source transistor n6 of the pair. The drain of the first common-source transistor is coupled to a first terminal of a first load component 54, and a second terminal of that load component is coupled to the upper supply rail. In the right branch, a second long-tail n5 has its source coupled to the lower supply rail and its drain coupled to the source of the second common-source transistor n7 of the pair. The drain of the second common-source transistor is coupled to a first terminal of a second load component 55, and a second terminal of that load component is coupled to the upper supply rail. The differential amplifier 50n may be coupled to the upper supply rail by said second terminals of its loads 54 and 55 via a further transistor such as PMOS transistor p3 arranged as a switch, allowing the differential amplifier to be selectively connected and disconnected to and from the power supply.

The sources of the two common-source transistors n6 and n7 are coupled together. Further, the node between the drain of the second common-source transistor n7 and the first terminal of the second load component 55 in the right branch (i.e., the output node) is coupled to the gates of both the first common-source transistor n6 and the first long-tail n4 in the left branch (the gate of n6 being the non-inverting input). Similarly, the node between the drain of the first common-source transistor n6 and the first terminal of the first load component 55 in the left branch (i.e., the complementary output node) is coupled to the gates of both the second common-source transistor n7 and the second long-tail n5 in the right branch (the gate of n7 being the inverting input). This creates the required positive feedback such that a change at an output reinforces a change at an input.

The long-tails n4 and n5 act as the current supply circuitry, in place of the current source 56. Since the differential output node voltages are also used to bias the long-tails n4 and n5 then the need for any bias voltage or current generation circuitry is avoided.

Unlike a current source, transistors n4 and n5 connected in the manner described do not act so that the total current flowing out of the long-tailed pair n6 and n7 is constant. However, when the differential amplifier is arranged in a circuit such as that of FIG. 7, n4 and n5 do still act such that a higher current in one branch will be at the expense of the current flowing in the other branch, and thus still ensure that n6 and n7 behave like a differential amplifier. The operation of these will be discussed in more detail below in relation to FIG. 7.

Figure 6:
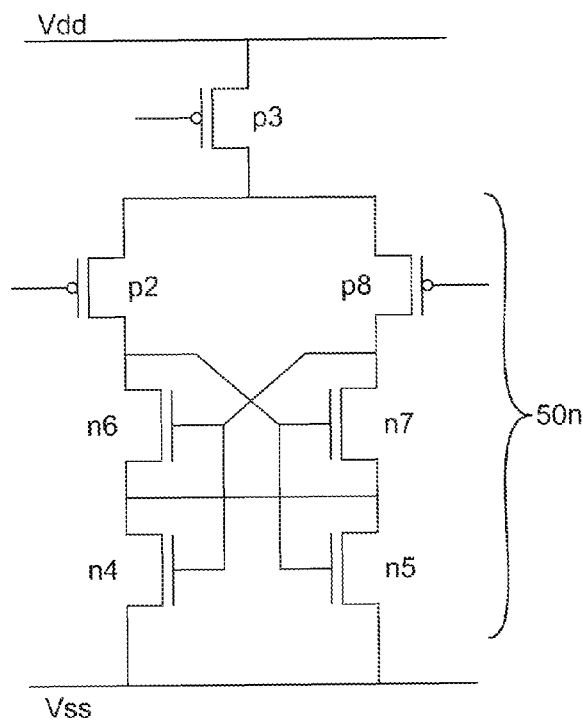
FIG. 6 is a schematic diagram of another differential amplifier connected in a positive feedback arrangement.

Referring now to FIG. 6 by way of an example, the present disclosure uses transistors connected in the load position of a differential amplifier 50. In the example of FIG. 6 the first load component 54 in the left branch includes a PMOS transistor p2 as a first load transistor or device, and the second load component 55 in the right branch includes a PMOS transistor p8 as a second load transistor or device. In this case, the source of each of the load transistors p2 and p8 is the above-mentioned first terminal, coupled to the drain of the respective common-source transistor n6 or n7; and the drain of each of the load transistors p2 and p8 is the above-mentioned second terminal, coupled to the supply rail (e.g., via switch p3).

Note that a similar differential amplifier 50p can also be constructed by swapping NMOS and PMOS transistors in the arrangement of FIG. 5 and swapping the upper and lower power rails.

The illustrated embodiment of FIG. 7 is now described in more detail. As mentioned, this shows a metastability resolving latch circuit including a pair of differential amplifiers 50. In this embodiment, the pair includes a first differential amplifier 50n like that of FIG. 6, consisting of common-source NMOSs n6 and n6, long-tail NMOSs n4 and n5, and load PMOSs p2 and p8; and a second differential amplifier 50p like that of FIG. 6 but with the semi-conductor types and supply rails reversed, consisting of common source PMOSs p6 and p7, long-tail PMOSs p4 and p5, and load NMOSs n2 and n8. The first differential amplifier is connected to the upper supply rail by a PMOS switch p3, and the second differential amplifier is connected to the lower supply rail via an NMOS switch n3. The output of the first differential amplifier is labeled 'a' and its complementary output is labeled 'an'. The output of the second differential amplifier is labeled 'b' and its complementary output is labeled 'bn' (the labeling of the branches is therefore flipped left-right from that shown in FIGS. 3a-6, but that doesn't matter since the branches are symmetrical: it is arbitrary which branch is considered to correspond to the output and inverting input and which branch is considered to correspond to the complementary output and non-inverting input).

The output 'a' of the first differential amplifier is coupled to the gate of the second load NMOS n8 in the second differential amplifier. The complementary output 'an' of the first differential amplifier is coupled to the gate of the first load NMOS n2 in the second differential amplifier. The output 'b' of the second differential amplifier is coupled to the gate of the second load PMOS p8 in the first differential amplifier. The complementary output 'bn' of the second differential amplifier is coupled to the gate of the first load PMOS p2 in the first differential amplifier. Thus the outputs of each of the two differential amplifiers are coupled to bias the load devices of the other of the two.

Transistors p3 and n3 are arranged as switches to connect and disconnect the differential amplifiers from the supply rails, in a manner described in more detail below.

In this example the complementary output 'an' of the first differential amplifier is coupled to the input of an inverter i4, the output of which is arranged to provide the logical output Q of the latch. However, any of 'a', 'an', 'b' and/or 'bn' could in principle provide a logical output of the latch, with suitable logic circuitry.

The latch further includes additional circuitry to provide an input stage to the differential amplifiers. This additional circuitry includes a NOR gate nr1, a NAND gate na1, a first inverter i1, a second inverter i2, and a third inverter i3 (the inverter i4 at the output may therefore be referred to as the fourth inverter). The additional circuitry also includes a first pull-up PMOS p1, a second pull-up PMOS p9, a first pull-down NMOS n1 and a second pull-down NMOS n9.

One input of the NOR gate nr1 and the input of the first inverter i1 are each arranged to receive the clock signal CK of the latch. The output of the first inverter i1 is coupled to one input of the NAND gate na1. The other input of each of the NOR gate nr1 and NAND gate na1 is arranged to receive the logical input signal of the latch. In FIG. 7 the output of the NOR gate nr1 is labelled clr and the output of the NAND gate na1 is labelled set_n.

The first pull-up PMOS has its source coupled to the upper supply rail, its drain coupled to the output 'a' of the first differential amplifier, and its gate coupled to the output set_n of the NAND gate na1. The first pull-down NMOS n1 has its source coupled to the lower supply rail, its drain coupled to the output 'b' of the second differential amplifier, and its gate is coupled to the output clr of the NOR gate nr1. The second pull-up PMOS p9 has its source coupled to the upper supply rail, its drain coupled to the complementary output 'an' of the first differential amplifier, and its gate coupled to the output clr of the NOR gate nr1 via the second inverter i2. The second pull-down NMOS n9 has its source coupled to the lower supply rail, its drain coupled to the complementary output 'bn' of the second differential amplifier, and its gate coupled to the output set_n of the NAND gate na1 via the third inverter i3.

In operation, the NOR gate nr1, NAND gate na1 and first inverter i1 generate clr and set_n according to the following truth table:

| CK D | clr | set_n |
|---|---|---|
| 0 | 1 | 1 |
| 0 | 0 | 0 |
| 0 | | |
| 1 | | |
| 1 | 0 | 1 |
| 0 | 0 | 1 |
| 1 | | |
| 1 | | |

When CK=0, the latch is transparent such that the output Q follows the input D. When CK=1, the latch is closed such that the output Q is latched (i.e., kept fixed) regardless of the input D.

When the latch is transparent and D=0, then both clr and set_n=1. Therefore the second pull-up PMOS p9 turns on, pulling 'an' up to Vdd; and the first pull-down NMOS n1 turns on, pulling 'b' down to Vss. Further, the first pull-up PMOS p1 and second pull-down NMOS n9 are turned off. However, NMOS switch n3 is on so that the upper PMOS differential amplifier is connected to the power supply, and since 'b' is low then the action of that differential amplifier is to force 'bn' high in a complementary fashion. When the latch is transparent and D=1, then both clr and set_n=0. Therefore the first pull-up PMOS p1 turns on, pulling 'a' up to Vdd; and the second pull-down NMOS n9 is turned on, pulling 'bn' down to Vss. Further, the second pull-up PMOS p9 and first pull-down NMOS n1 are turned off. However, PMOS p3 is on so that the lower NMOS differential amplifier is connected to the power supply, and since 'a' is high then the action of that differential amplifier is to force 'an' low in a complementary fashion.

When CK transitions from 0 to 1, the latch closes in order to latch (i.e., fix) the output value Q to the most recent value of the data input D. However, if the input D was changing from one logical state to another at the time of latching, then the latch may become metastable. That is, the voltages at the nodes 'a', 'b', 'an' and 'bn' will be close to (but never exactly) half the supply voltage, i.e., half way between Vdd and Vss. So either 'a' and 'b' will be very slightly above half way and 'an' and 'bn' very slightly below half way, or vice versa, but this small difference is not sufficient to reliably represent a logical value.

Therefore in order to ensure the latch resolves into one logical state or another, the small difference is boosted by the feedback between the pair of differential amplifiers, i.e., by the loads of each differential amplifier of the pair being driven by the outputs of the other of the pair. Both p3 and n3 are 'on' when CK=1 (since clr=0 and set_n=1), and thus both differential amplifiers are connected to the power supply. The output 'a' of the first differential amplifier then drives the second load NMOS n8 in the second differential amplifier, the complementary output 'an' of the first differential amplifier drives the first load NMOS n2 in the second differential amplifier, the output 'b' of the second differential amplifier drives the second load PMOS p8 in the first differential amplifier, and the complementary output 'bn' of the second differential amplifier drives the first load PMOS p2 of the first differential amplifier. This results in a fast resolution of metastability, especially at low supply voltages.

The purpose of the switches p3 and n3 is to ensure that all four nodes of the circuit ('a', 'an', 'b' and 'bn') can be switched from one logical state to the other when the latch is transparent (CK=0). When transparent, only one of p3 and n3 will be on at any one time and so only one of the two differential amplifiers will be connected to the power supply at any one time, which one depending on the value of the input data D. For example; imagine that a=b=1 and an=bn=0. Further, imagine that input CK transitions from 1 to 0 while D=0 so that node clr transitions from 0 to 1. Device n1 turns on and is strong enough to force node 'b' to 0 (in spite of p6 in series with p4). Similarly p9 turns on and is strong enough to force node 'an' to (in spite of n6 in series with n4). However, were it not for switch p3, node 'a' would remains stuck at 1 since series devices n6,n4 are not strong enough to overcome p2 and similarly node 'bn' would remains stuck at 0 since series devices p7,p5 are not strong enough to overcome n8. Turning off p3 breaks this deadlock; allowing 'a' to discharge to 0 through n6 which turns off n8 and allows 'bn' to charge to 1 through p7. The behavior is symmetric for forcing the latch in the opposite sense using set_n.

This latch circuit represents a cheaply manufacturable, low power circuit for fast metastability resolution at low power supply voltages in CMOS integrated circuits. Its use may be particularly advantageous in SOC (system on chip) ICs in cost sensitive, low power, battery operated consumer devices where the power supply voltage can be dynamically optimized to minimize power consumption. This is because the speed of the described synchronizing latch scales nearly proportionally to the speed of standard CMOS gates built using the same transistors. Thus the synchronizing latch does not impose a lower limit on the supply voltage.

This circuit can also resolve metastability very quickly even at higher supply voltages, making it a better performing circuit than most other solutions based on prior art.

Furthermore, since the differential output node voltages are also used to bias the long-tails (p4,p5 & n4,n5) the need for any bias voltage or current generation circuitry can be avoided.

As mentioned, unlike a current source, transistors n4 and n5 in the arrangement of FIG. 7 (and similarly p4 and p5) do not act so that the total current flowing out of the long-tailed pair n6 and n7 (or p4 and p5) is constant. However, they do still act such that a higher current in one branch will be at the expense of the current flowing in the other branch, and thus still ensure that the circuit behaves like a differential amplifier. This works as long as the current flowing remains sufficiently high.

Figure 8:
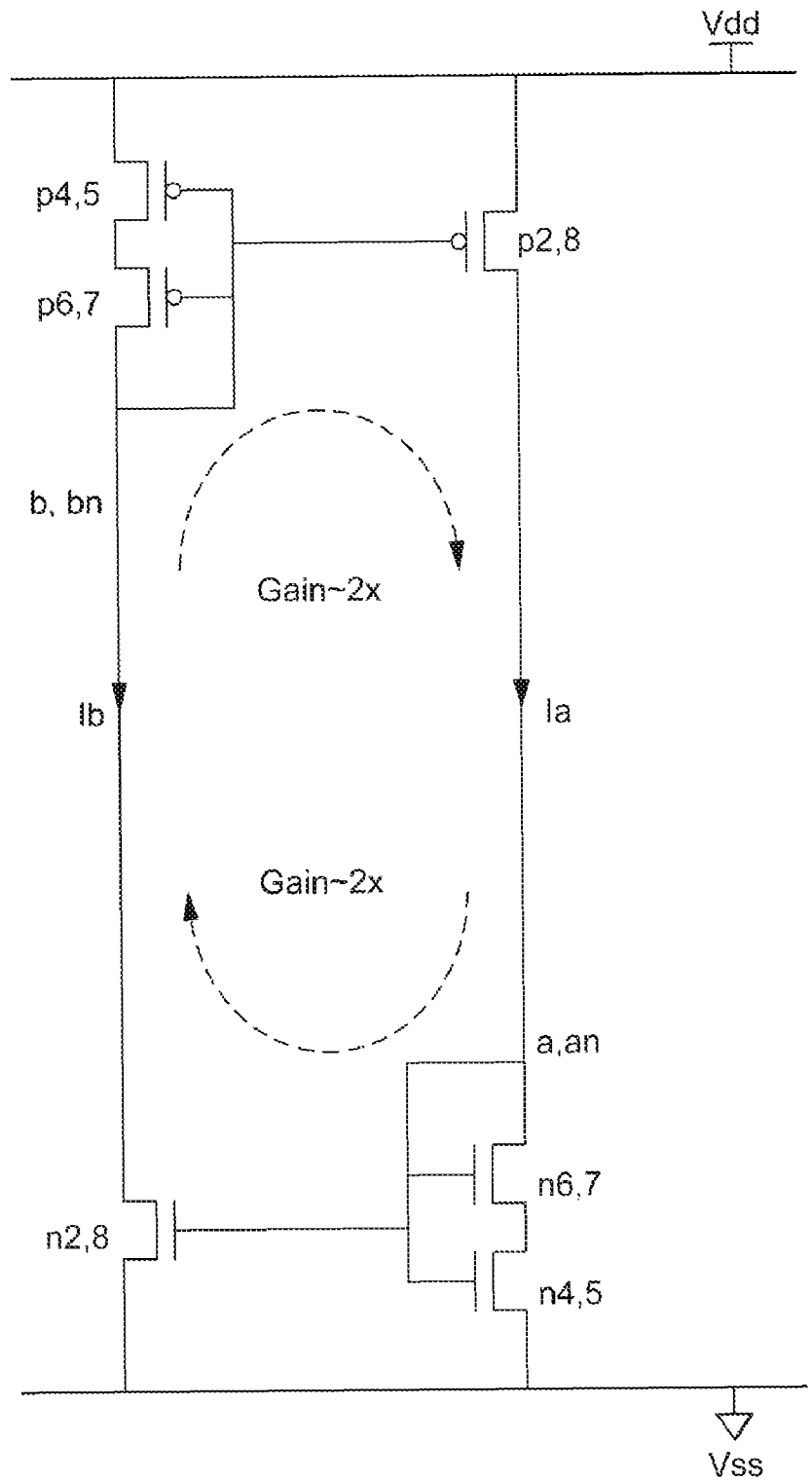
FIG. 8 is a schematic diagram of another latch.

To understand why the total current does not dwindle to nothing, imagine that the circuit of FIG. 7 is perfectly balanced (ie: metastable) with voltages at b=bn and a=an. Assume also that p1,n1,p9 and n9 are all off, while p3 and n3 are both on (ie: the circuit is resolving and is not in its 'transparent' mode). The circuit can be simplified to the one shown in FIG. 8. At this balance point; devices n4,5,6,7 form a current mirror with devices n2,8. The mirror has a small signal gain of about two (assuming that all individual devices are similarly sized, which is the case in one implementation) since devices n6,7 are in series with devices n4,5, effectively creating a long channel device. In practice, the gain is likely to be even higher than this because n6,7 are effected slightly by body biasing (Vbs<0). The PMOS devices behave similarly, providing an overall loop gain of more than four. (NB: It is important that the loop gain is greater than one or both Ia and Ib will diminish).

Thus: Ib and Ia (the long tail currents) will tend to increase, strongly biasing the differential amplifiers so that they resolve quickly.

Note that in the circuit arrangement of FIG. 7, there may occur an unwanted state from which the circuit can not escape. This is when 'a' and 'an' are both near to 0 v (Vss) while 'b' and 'bn' are both near to Vdd. In this case: PMOS devices p2,p4,p5,p6,p7,p8 and NMOS devices n2,n4,n5,n6, n7,n8 are all switched 'off' and nodes 'a', 'an', 'b' and 'bn' can remain static without resolving.

This state is avoided as long as the latch starts from one its stable states (either a=b=Vdd, an=bn=Vss or a=b=Vss, an=bn=Vdd). Therefore in one embodiment this should be arranged to be so.

For example, assume that input D=0 while CK=0. This causes the output of gate nr1, clr=Vdd. Consequently devices n1 and p9 are turned on. These devices are made large enough to overcome stacks p4,p6 and n5,n7 respectively and so, b=0 and an=Vdd. Devices n6 and p7 then drive a=0 and bn=Vdd respectively.

Now assume that input D transitions from 0 to Vdd just before input CK transitions from 0 to Vdd. The transition on D will lead to node clr=0 and the voltage on node set_n will begin to drop until CK rises. Thus a 'glitch' can be said to have occurred on node set_n. While input CK=Vdd; the latch circuit must make rapid progress towards a firm decision as to whether this glitch on set_n was large enough to change the state or not.

During the glitch, devices p1 and n9 will have been turned on momentarily. During this time, node 'a' will have risen and node 'bn' will have dropped in voltage. If these nodes have time to move by more than $V_{threshold}$ then devices n7 and p6 may turn on pulling 'an' towards 0 v and 'bn' towards Vdd respectively. Crucially, regardless of the magnitude of the glitch, at all times; one of the pair 'a', 'an' is sure to be above $V_{threshold}$, and one of the pair 'b', 'bn' is sure to be below Vdd–$V_{threshold}$. This ensures that one of the long-tail devices (p4,p5 & n4,n5) in each of the differential amplifiers always remains on avoiding the previously described unwanted state where both of the differential amplifiers are completely switched off.

Figure 9:
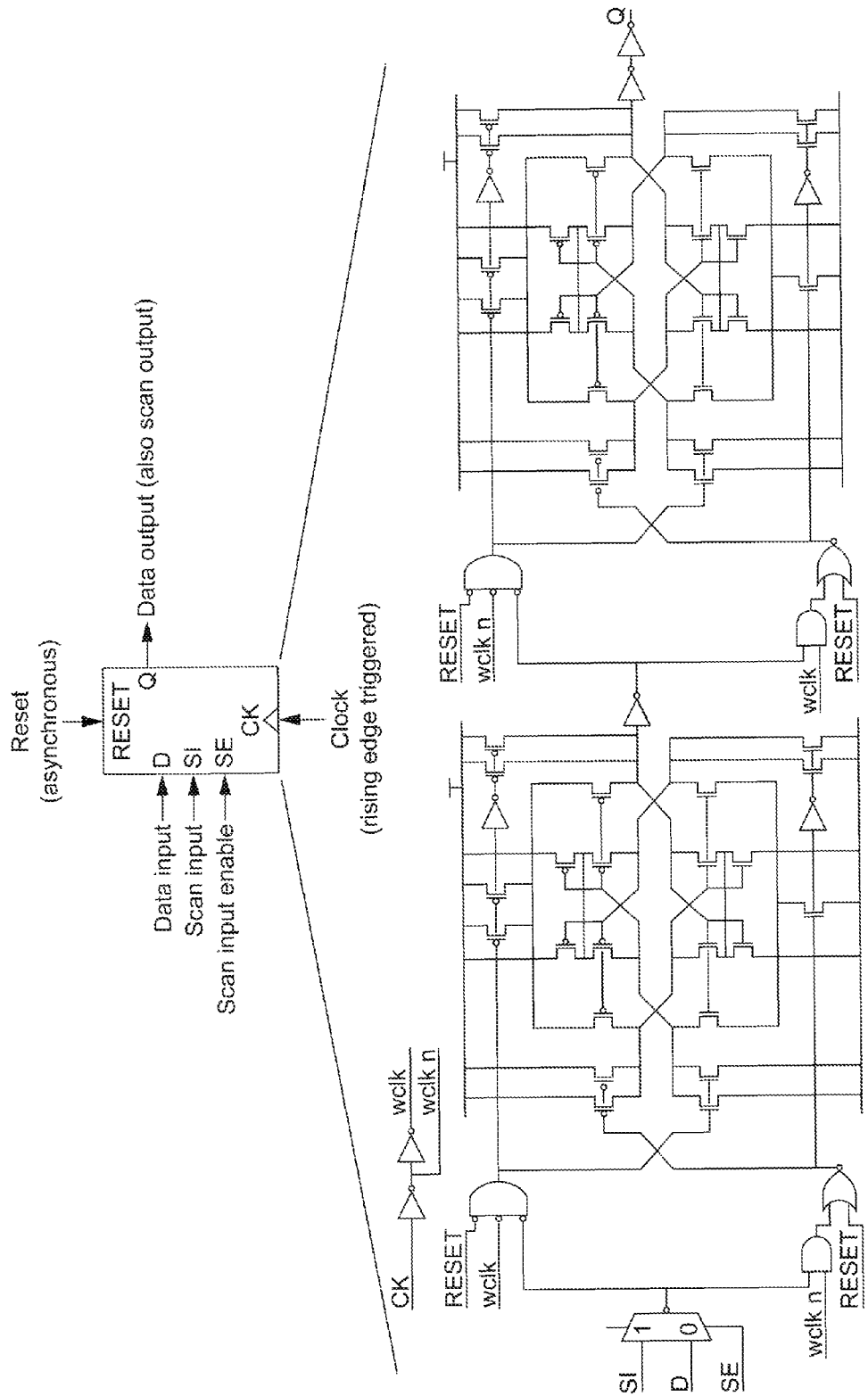
FIG. 9 is a schematic diagram of a scan testable flip-flop with an asynchronous reset input.

The latch element described herein can be used to build a scan testable flip-flop with an asynchronous reset input (this is a commonly used component in many standard logic cell libraries used in the IC industry today). The circuit for such a flip-flop is illustrated schematically in FIG. 9.

It will be appreciated that the above embodiments are described only by way of example. In other embodiments for instance, the latch circuit be useful in other circuit technologies than CMOS and may be built from other types of transistor than MOSFETS. In that case, the relevant substitutions in the above terminology (gate, source, drain, etc) will be apparent to a person skilled in the art given the disclosures herein. Further, other designs of differential amplifier may be used in the present disclosure, and different arrangements of feedback may be used. Further, the disclosure may have applications other than to low-power battery powered units, e.g., in very high speed applications. Other applications and configurations may be apparent to the person skilled in the art given the disclosure herein. The scope of this application is not limited by the described embodiments, but only by the following claims. Those skilled in the art to which this application relates will appreciate that other and further additions, deletions, substitutions and modifications may be made to the described embodiments.

What is claimed is:

1. A logic circuit latch for switching between a transparent state in which a logical output of the latch follows a logical input signal and a closed state in which the logical output is latched, the latch comprising:
an input stage for receiving the logical input signal; and
a pair of differential amplifiers, each having an input operatively coupled to the input stage of the latch, and at least one of the differential amplifiers having an output arranged to supply the logical output of the latch;
wherein each of the differential amplifiers comprises a transistor connected as a load, and an output of each of the differential amplifiers is coupled to bias the load transistor of the other differential amplifier; so as, if the latch switches from the transparent state to the closed state while the logical input signal is transitioning between logical levels, to drive up the logical output of the latch if the logical input signal transitions from a first to a second logical level, and to drive down the logical output of the latch if the input signal transitions from the second to the first logical level.

2. The latch of claim 1, wherein each of the differential amplifiers is connected in a positive feedback arrangement such that a change at the output of the respective differential amplifier reinforces a change at its input.

3. The latch of claim 2, wherein:
each of the differential amplifiers comprises a non-inverting input, an inverting input, an output and a complementary output; and
the output of a first of the differential amplifiers is coupled back to the non-inverting input of a second of the differential amplifiers, the complementary output of the first differential amplifier is coupled back to the inverting input of the second differential amplifier, the output of the second differential amplifier is coupled back to the non-inverting input of the first differential amplifier, and the complementary output of the second differential amplifier is coupled back to the inverting input of the first differential amplifier.

4. The latch of claim 1, wherein:
each of the differential amplifiers comprises a first branch having an output and a respective load transistor, and a second branch having a complementary output and a respective second load transistor; and
the output from the first branch of the first differential amplifier is coupled to bias the load transistor in the second branch of the second differential amplifier, the complementary output from the second branch of the first differential amplifier is coupled to bias the load transistor in the first branch of the second differential amplifier, the output from the first branch of the second differential amplifier is coupled to bias the load in the second branch of the first differential amplifier, and the complementary output from the second branch of the second differential amplifier is coupled to bias the load in the first branch of the first differential amplifier.

5. The latch of claim 1, wherein a first of the differential amplifiers comprises an arrangement of transistors each of a respective semi-conductor type, and a second of the differential amplifiers comprises a corresponding arrangement of transistors each of the opposite semiconductor type to a counterpart in the first, said corresponding arrangement being inverted with respect to supply rails of the latch.

6. The latch of claim 1, wherein each of the differential amplifiers comprises a long-tailed pair arrangement comprising a pair of long-tailed transistors, a pair of long-tail transistors and a pair of loads.

7. The latch of claim 5, wherein each of the differential amplifiers comprises a long-tailed pair arrangement comprising a pair of long-tailed transistors, a pair of long-tail transistors and a pair of loads and the long-tailed and long-tail transistors of a first of the differential amplifiers are of a first semiconductor type and the load transistors of the first differential amplifier are of a second, opposite semi-conductor type; and wherein the long-tailed and long-tail transistors of a second of the differential amplifiers are of the second semi-conductor type and the load transistors of the second differential amplifier are of the first semi-conductor type.

8. The latch of claim 6, wherein in each of the differential amplifiers:
   each of said long-tailed, long-tail and load transistors comprises two conducting terminals and a control terminal for controlling conduction between the two respective conducting terminals;
   each long-tail transistor of the pair has one conducting terminal coupled to a supply rail, its other conducting terminal coupled to the other conducting terminal of the other long-tail transistor of the pair and to a conducting terminal of a respective one of said long-tailed transistors, and its control terminal coupled to the control terminal of its respective long-tail transistor and to the other conducting terminal of the other long-tailed transistor;
   each of the long-tailed transistors has said other conducting terminal coupled to a conducting terminal of a respective one of the load transistors, and the other conducting terminal of each load transistor is coupled to another supply rail; and
   a node between one of the long-tailed transistors and its respective load transistor is arranged to provide an output of the differential amplifier, and a node between the other of the long-tailed transistors and its respective load transistor is arranged to provide a complementary output of the differential amplifier, the former of said load transistors being biased by the complementary output from the other of said differential amplifiers and the latter of said load transistors being biased by the output from that other differential amplifier.

9. The latch of claim 7, wherein in each of the differential amplifiers:
   each of said long-tailed, long-tail and load transistors comprises two conducting terminals and a control terminal for controlling conduction between the two respective conducting terminals;
   each long-tail transistor of the pair has one conducting terminal coupled to a supply rail, its other conducting terminal coupled to the other conducting terminal of the other long-tail transistor of the pair and to a conducting terminal of a respective one of said long-tailed transistors, and its control terminal coupled to the control terminal of its respective long-tail transistor and to the other conducting terminal of the other long-tailed transistor;
   each of the long-tailed transistors has said other conducting terminal coupled to a conducting terminal of a respective one of the load transistors, and the other conducting terminal of each load transistor is coupled to another supply rail; and
   a node between one of the long-tailed transistors and its respective load transistor is arranged to provide an output of the differential amplifier, and a node between the other of the long-tailed transistors and its respective load transistor is arranged to provide a complementary output of the differential amplifier, the former of said load transistors being biased by the complementary output from the other of said differential amplifiers and the latter of said load transistors being biased by the output from that other differential amplifier.

10. The latch of claim 1, wherein each of the differential amplifiers is coupled to a supply rail via a further transistor arranged as a switch, arranged such that when the latch is closed then both differential amplifiers are connected to a power supply, and when the latch is transparent then only one of the two differential amplifiers is connected to the power supply at any one time depending on the logical level of the input signal.

11. The latch of claim 1, wherein the input stage is arranged to supply a combination of inputs representing said logical input signal to a first of the differential amplifiers, and to supply a complementary combination of inputs to a second of the differential amplifiers.

12. A circuit having a supply voltage and comprising a logic circuit latch for switching between a transparent state in which a logical output of the latch follows a logical input signal and a closed state in which the logical output is latched, the latch comprising:
   an input stage for receiving the logical input signal; and
   a pair of differential amplifiers, each having an input operatively coupled to the input stage of the latch, and at least one of the differential amplifiers having an output arranged to supply the logical output of the latch;
   wherein each of the differential amplifiers comprises a transistor connected as a load, and an output of each of the differential amplifiers is coupled to bias the load transistor of the other differential amplifier; so as, if the latch switches from the transparent state to the closed state while the logical input signal is transitioning between logical levels, to drive up the logical output of the latch if the logical input signal transitions from a first to a second logical level, and to drive down the logical output of the latch if the input signal transitions from the second to the first logical level, wherein the latch is made up of transistors all having substantially the same threshold voltage, and the supply voltage of the circuit is substantially equal to or less than twice the threshold voltage of the transistors making up the latch.

13. The circuit of claim 12, wherein the circuit is a CMOS circuit and the threshold voltage is the CMOS threshold voltage.

14. A battery powered portable device comprising a logic circuit latch for switching between a transparent state in which a logical output of the latch follows a logical input signal and a closed state in which the logical output is latched, the latch comprising:
   an input stage for receiving the logical input signal; and
   a pair of differential amplifiers, each having an input operatively coupled to the input stage of the latch, and at least one of the differential amplifiers having an output arranged to supply the logical output of the latch;

wherein each of the differential amplifiers comprises a transistor connected as a load, and an output of each of the differential amplifiers is coupled to bias the load transistor of the other differential amplifier; so as, if the latch switches from the transparent state to the closed state while the logical input signal is transitioning between logical levels, to drive up the logical output of the latch if the logical input signal transitions from a first to a second logical level, and to drive down the logical output of the latch if the input signal transitions from the second to the first logical level.

15. A method of operating a latch, comprising:
receiving a logical input signal;
operating the latch in a transparent state in which a logical output of the latch follows the logical input signal;
switching the latch to a closed state in which the logical output is latched;
supplying the logical output from at least one of a pair of differential amplifiers forming part of the latch; and
biasing a load transistor of one of the differential amplifiers using the output of the other, and vice versa; so as, if the latch switches from the transparent state to the closed state while the logical input signal is transitioning between logical levels, to drive up the logical output of the latch if the logical input signal transitions from a first to a second logical level, and to drive down the logical output of the latch if the input signal transitions from the second to the first logical level.

16. The method of claim 15, comprising operating each of the differential amplifiers in positive feedback such that a change at the output of the respective differential amplifier reinforces a change at its input.

17. The method of claim 15, comprising: when the latch is closed, connecting both differential amplifiers to a power supply, and when the latch is transparent, connecting only one of the two differential amplifiers to the power supply at any one time depending on the logical level of the input signal.

18. The method of claim 16, comprising: when the latch is closed, connecting both differential amplifiers to a power supply, and when the latch is transparent, connecting only one of the two differential amplifiers to the power supply at any one time depending on the logical level of the input signal.

19. The method of claim 15, performed in a battery powered portable device.

20. A method of manufacturing a circuit comprising a logic circuit latch for switching between a transparent state in which a logical output of the latch follows a logical input signal and a closed state in which the logical output is latched, the latch comprising:
an input stage for receiving the logical input signal; and
a pair of differential amplifiers, each having an input operatively coupled to the input stage of the latch, and at least one of the differential amplifiers having an output arranged to supply the logical output of the latch;
wherein each of the differential amplifiers comprises a transistor connected as a load, and an output of each of the differential amplifiers is coupled to bias the load transistor of the other differential amplifier; so as, if the latch switches from the transparent state to the closed state while the logical input signal is transitioning between logical levels, to drive up the logical output of the latch if the logical input signal transitions from a first to a second logical level, and to drive down the logical output of the latch if the input signal transitions from the second to the first logical level, comprising manufacturing the latch from transistors all having substantially the same threshold voltage, and arranging for the supply voltage of the circuit to be substantially equal to or less than twice the threshold voltage of the transistors making up the latch.

21. The method of claim 20, wherein the circuit is a CMOS circuit and the threshold voltage is the CMOS threshold voltage.

22. The method of claim 20, comprising arranging the circuit for operation in a battery powered portable device.

23. The method of claim 21, comprising arranging the circuit for operation in a battery powered portable device.

24. A battery powered portable device comprising a circuit having a supply voltage and comprising a logic circuit latch for switching between a transparent state in which a logical output of the latch follows a logical input signal and a closed state in which the logical output is latched, the latch comprising:
an input stage for receiving the logical input signal; and
a pair of differential amplifiers, each having an input operatively coupled to the input stage of the latch, and at least one of the differential amplifiers having an output arranged to supply the logical output of the latch;
wherein each of the differential amplifiers comprises a transistor connected as a load, and an output of each of the differential amplifiers is coupled to bias the load transistor of the other differential amplifier; so as, if the latch switches from the transparent state to the closed state while the logical input signal is transitioning between logical levels, to drive up the logical output of the latch if the logical input signal transitions from a first to a second logical level, and to drive down the logical output of the latch if the input signal transitions from the second to the first logical level, wherein the latch is made up of transistors all having substantially the same threshold voltage, and the supply voltage of the circuit is substantially equal to or less than twice the threshold voltage of the transistors making up the latch.

* * * * *